(12) United States Patent
Kanematsu et al.

(10) Patent No.: US 11,530,498 B2
(45) Date of Patent: Dec. 20, 2022

(54) RESIN STRUCTURE

(71) Applicant: Murata Manufacturing Co., Ltd., Nagaokakyo (JP)

(72) Inventors: Shunsuke Kanematsu, Nagaokakyo (JP); Kenichiro Takumi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 260 days.

(21) Appl. No.: 16/987,468

(22) Filed: Aug. 7, 2020

(65) Prior Publication Data

US 2020/0362484 A1    Nov. 19, 2020

Related U.S. Application Data

(63) Continuation of application No. PCT/JP2019/045984, filed on Nov. 25, 2019.

(30) Foreign Application Priority Data

Nov. 26, 2018 (JP) .............................. JP2018-219963

(51) Int. Cl.
| | | |
|---|---|---|
| *D02G 3/44* | (2006.01) | |
| *D02G 3/26* | (2006.01) | |
| *D02G 3/36* | (2006.01) | |
| *D06M 15/507* | (2006.01) | |
| *D06M 15/55* | (2006.01) | |

(52) U.S. Cl.
CPC ............... *D02G 3/441* (2013.01); *D02G 3/26* (2013.01); *D02G 3/36* (2013.01); *D06M 15/507* (2013.01); *D06M 15/55* (2013.01)

(58) Field of Classification Search
CPC .. D02G 3/06; D02G 3/26; D02G 3/36; D02G 3/441
USPC ........................................................ 57/31, 260
See application file for complete search history.

(56) References Cited

U.S. PATENT DOCUMENTS

| | | | | |
|---|---|---|---|---|
| 3,453,816 A | * | 7/1969 | Martin ..................... | D02G 3/06 428/398 |
| 6,127,035 A | * | 10/2000 | Carter .................... | D03D 15/47 442/178 |
| 2012/0164908 A1 | * | 6/2012 | Kunimoto ............. | A61F 13/513 264/103 |
| 2016/0145775 A1 | * | 5/2016 | Ma .......................... | D01D 5/42 57/260 |
| 2018/0355525 A1 | | 12/2018 | Ando et al. | |

(Continued)

FOREIGN PATENT DOCUMENTS

| | | |
|---|---|---|
| CN | 108495961 A | 9/2018 |
| JP | 2006225821 A | 8/2006 |

(Continued)

OTHER PUBLICATIONS

International Search Report Issued for PCT/JP2019/045984, dated Feb. 4, 2020.

(Continued)

*Primary Examiner* — Shaun R Hurley
(74) *Attorney, Agent, or Firm* — ArentFox Schiff LLP

(57) ABSTRACT

A resin structure that includes a plurality of piezoelectric fibers that generate a charge by application of external energy; and an insulating resin coating at least one of the plurality of piezoelectric fibers.

19 Claims, 6 Drawing Sheets

(56) References Cited

U.S. PATENT DOCUMENTS

| | | |
|---|---|---|
| 2019/0038787 A1 | 2/2019 | Ando |
| 2019/0078239 A1 | 3/2019 | Ando et al. |
| 2019/0281820 A1 | 9/2019 | Usui et al. |

FOREIGN PATENT DOCUMENTS

| | | | |
|---|---|---|---|
| JP | 2016213262 A | 12/2016 | |
| JP | 6292368 B1 | 3/2018 | |
| WO | 2018116970 A1 | 6/2018 | |
| WO | 2018211817 A1 | 11/2018 | |

OTHER PUBLICATIONS

Written Opinion of the International Searching Authority issued for PCT/JP2019/045984, dated Feb. 4, 2020.

Microorganism Control-Science and Engineering published by Kodansha Ltd, Copyright T. Tsuchido, H Kourai, H. Matsuoka, J. Koizumi, 2002; "Electrical Control" Section 4.1.3, p. 50. (Translation of section 4.1.3, p. 50).

Koichi Takaki; "Agricultural and Food Processing Applications of High-Voltage and Plasma Technologies"; J. Htsj, vol. 51, No. 216, Jul. 2012, pp. 64-69, translation of p. 67, section 5.

* cited by examiner

RESIN STRUCTURE

CROSS REFERENCE TO RELATED APPLICATIONS

The present application is a continuation of International application No. PCT/JP2019/045984, filed Nov. 25, 2019, which claims priority to Japanese Patent Application No. 2018-219963, filed Nov. 26, 2018, the entire contents of each of which are incorporated herein by reference.

FIELD OF THE INVENTION

The present invention relates to a resin structure including piezoelectric fibers.

BACKGROUND OF THE INVENTION

Patent Document 1 discloses a fiber exhibiting antibacterial properties through a charge generated by a piezoelectric effect of the fiber.

Patent Document 1: Japanese Patent No. 6292368

SUMMARY OF THE INVENTION

There are many gaps among fibers constituting a yarn or a cloth. Therefore, deformation of the yarn or the cloth including piezoelectric fibers allows the piezoelectric fibers to freely move among the gaps, so that deformation of the piezoelectric fibers themselves is small or sometimes does not occur.

In order to address this problem, an object of the present invention is to provide a resin structure capable of efficiently deforming piezoelectric fibers.

A resin structure of the present invention includes a plurality of piezoelectric fibers that generate a charge by application of external energy; and an insulating resin coating at least one of the plurality of piezoelectric fibers.

The resin structure of the present invention that includes the piezoelectric fibers held by the insulating resin enables efficient deformation of the piezoelectric fibers when the whole of the resin structure is deformed. Accordingly, the resin structure of the present invention is capable of generating a charge by application of a smaller amount of energy, thereby enabling efficient deformation of the piezoelectric fibers.

DETAILED DESCRIPTION OF THE INVENTION

Figure 1A:
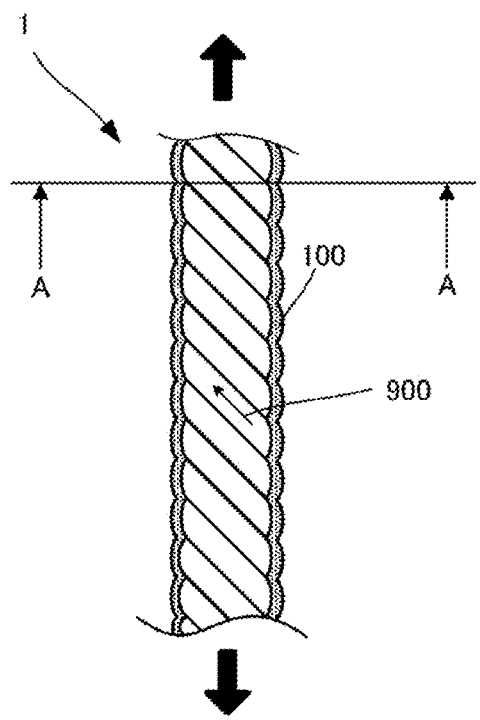
FIG. 1(A) is a view illustrating a configuration of a resin structure 1.
Figure 1B:
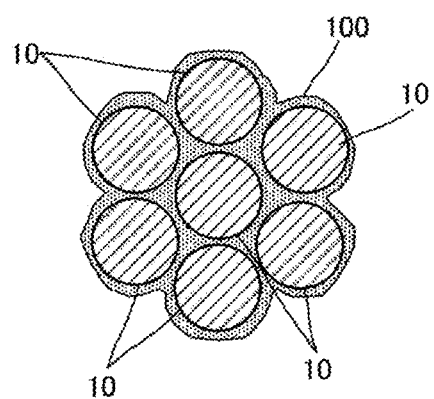
FIG. 1(B) is a sectional view along line A-A in FIG. 1(A).

FIG. 1(A) is a partially exploded view illustrating a configuration of a resin structure 1, and FIG. 1(B) is a sectional view along line A-A in FIG. 1(A).

The resin structure 1 includes a plurality of piezoelectric fibers 10 and an insulating resin 100. The plurality of piezoelectric fibers 10 are each a fiber having a circular section. The plurality of piezoelectric fibers 10 are collectively left-twisted to constitute a left-twisted yarn (hereinafter, referred to as an S yarn). The present embodiment describes, as an example, the resin structure 1 formed by twisting seven piezoelectric fibers 10. The number of the piezoelectric fibers 10, the number of twists, and the number of filaments of the yarn are actually appropriately set in view of the use or the like of the resin structure 1.

The insulating resin 100 is formed so as to cover the whole of the plurality of twisted piezoelectric fibers 10. The resin structure 1, however, only needs to include at least one piezoelectric fiber 10 covered with the insulating resin 100. The insulating resin 100 may separately cover each one of the piezoelectric fibers 10. That is, a plurality of piezoelectric fibers 10 each covered with the insulating resin 100 may be prepared and twisted together to constitute the resin structure 1.

The piezoelectric fiber 10 is produced, for example, by a technique of extrusion-molding a piezoelectric polymer into a fiber. Alternatively, the piezoelectric fiber 10 is produced, for example, by a technique of melt-spinning a piezoelectric polymer into a fiber (including, for example, a spinning and drawing method in which a spinning step and a drawing step are performed separately from each other, a direct drawing method in which a spinning step and a drawing step are linked to each other, a POY-DTY method in which a false twisting step can also be performed simultaneously, or a super high speed spinning method in which spinning is accelerated); a technique of dry- or wet-spinning a piezoelectric polymer into a fiber (including, for example, a phase-separating method or a dry-wet-spinning method of dissolving a raw material polymer in a solvent and extruding the solution through a nozzle into a fiber, a gel spinning method of making a polymer into a gel uniform fiber containing a solvent, or a liquid crystal spinning method of making a liquid crystal solution or a melted liquid crystal into a fiber); or a technique of spinning a piezoelectric polymer electrostatically into a fiber. The sectional shape of the piezoelectric fiber 10 is not limited to a circular shape.

Some piezoelectric polymers are pyroelectric and some are non-pyroelectric, and both the piezoelectric polymers are usable. For example, PVDF (polyvinylidene fluoride) is pyroelectric and generates a charge also due to a temperature change. The piezoelectric polymer, such as PVDF, which is pyroelectric generates a charge also due to heat energy of a human body. In this case, the heat energy of the human body is external energy.

Polylactic acid (PLA) is a piezoelectric polymer that is not pyroelectric. Polylactic acid exerts piezoelectric properties when uniaxially stretched. As polylactic acid, there are PLLA that is obtained by polymerizing an L-form monomer and has a right-handed helical structure; and PDLA that is obtained by polymerizing a D-form monomer, has a left-handed helical structure, and has a piezoelectric constant having a reverse polarity to the polarity of the piezoelectric constant of the PLLA.

Figure 2A:
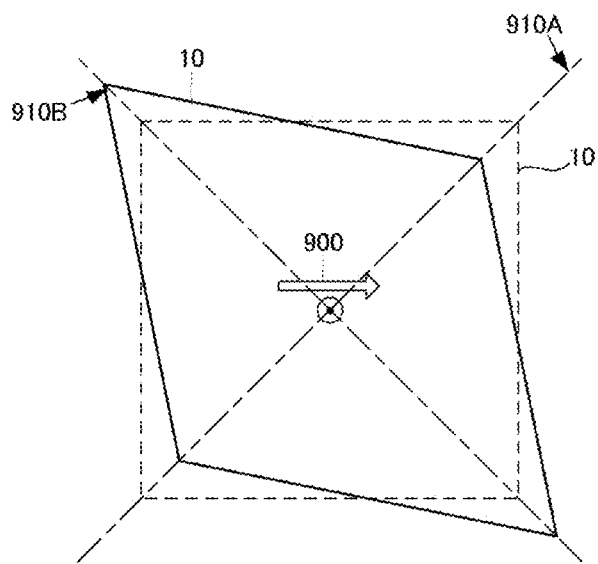
FIGS. 2(A) and 2(B) are views illustrating a relationship of a uniaxially stretching direction of polylactic acid, an electric field direction, and deformation of a piezoelectric fiber 10.
Figure 2B:
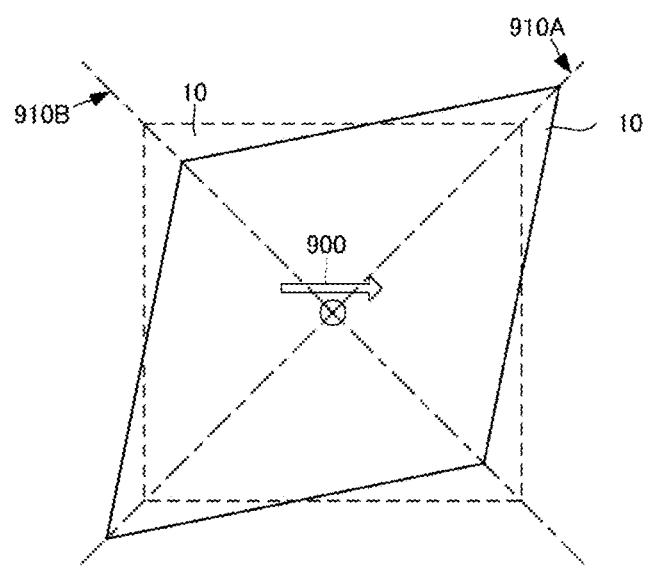

FIGS. 2(A) and 2(B) are views illustrating, in the case where the piezoelectric fiber 10 is uniaxially stretched PLLA, a relationship of a uniaxially stretching direction, deformation of the piezoelectric fiber 10, and an electric field direction. FIGS. 2(A) and 2(B) are views of a model case assuming that the piezoelectric fiber 10 has a film shape.

Polylactic acid is one example of chiral polymers and includes a main chain having a helical structure. Polylactic acid exerts piezoelectric properties due to molecular orientation brought by a uniaxial stretch of the polylactic acid. Further, polylactic acid increases its piezoelectric constant when subjected to a heat treatment to increase its crystallinity. The piezoelectric fiber 10 made of uniaxially stretched polylactic acid has piezoelectric strain constants $d_{14}$ and $d_{25}$ as tensor components when a thickness direction is defined as a first axis, a stretching direction 900 is defined as a third axis, and a direction perpendicular to both the first axis and the third axis is defined as a second axis. Therefore, the piezoelectric fiber 10 made of uniaxially stretched polylactic acid generates a charge when strained in a direction at 45 degrees to the uniaxially stretching direction.

As illustrated in FIG. 2(A), when the piezoelectric fiber 10 is contracted in a direction along a first diagonal line 910A and stretched in a direction along a second diagonal line 910B perpendicular to the first diagonal line 910A, an electric field is generated in a direction from the back plane to the front plane of the drawing figure. That is, the piezoelectric fiber 10 generates a negative charge on the front plane of the drawing figure.

As illustrated in FIG. 2(B), when stretched in the direction along the first diagonal line 910A and contracted in the direction along the second diagonal line 910B, the piezoelectric fiber 10 also generates a charge. In this case, the polarity of the charge is reversed, and an electric field is generated in a direction from the front plane to the back plane of the drawing figure. That is, the piezoelectric fiber 10 generates a positive charge on the front plane of the drawing figure in the example of FIG. 2(B).

Polylactic acid that exerts piezoelectric properties due to molecular orientation brought by the stretch requires no poling treatment unlike other piezoelectric polymers such as PVDF, or piezoelectric ceramic. Uniaxially stretched polylactic acid has a piezoelectric constant of approximately 5 to 30 pC/N, which is very high among polymers. Further, the piezoelectric constant of polylactic acid does not vary over time and is very stable.

The piezoelectric fiber 10 having the properties noted above is described when applied to the resin structure 1 in FIG. 1(A). In FIG. 1(A), a stretching direction 900 of each of the piezoelectric fibers 10 coincides with the axial direction of each of the piezoelectric fibers 10. The plurality of piezoelectric fibers 10 are twisted to make the stretching direction 900 of the piezoelectric fibers 10 inclined at 45 degrees to the left with respect to the axial direction of the resin structure 1.

When the resin structure 1 in this state is extended with tension along the axial direction of the resin structure 1, the piezoelectric fibers 10 are strained along the axial direction of the resin structure 1 to cause a shear stress along the axial direction of the resin structure 1. The axial direction of the resin structure 1 corresponds to the second diagonal line 910B in the example of FIG. 2(A). Under this condition, the piezoelectric fibers 10 is, as illustrated in the example of FIG. 2(A), contracted in the direction corresponding to the first diagonal line 910A and stretched in the direction corresponding to the direction along the second diagonal line 910B. Therefore, a negative charge is generated on a surface of the resin structure 1, and a positive charge is generated inside the resin structure 1.

The piezoelectric fibers 10 generate a charge by application of the shear stress and therefore do not limit the inclination of the stretching direction 900 to 45 degrees to the left with respect to the axial direction of the resin structure 1. The stretching direction 900 at least needs to intersect the axial direction of the resin structure 1. That is, the stretching direction 900 of the piezoelectric fibers 10 only needs to be at more than 0 degrees and less than 90 degrees to the left with respect to the axial direction of the resin structure 1.

The resin structure 1 is shaped to include the plurality of piezoelectric fibers 10 covered with the insulating resin 100. The insulating resin 100 holds the plurality of piezoelectric fibers 10. The extension of the resin structure 1 with tension along the axial direction of the resin structure 1 also deforms the insulating resin 100 simultaneously with the plurality of piezoelectric fibers 10. Accordingly, the tension along the axial direction of the resin structure 1 is efficiently converted into the shear stress of the plurality of piezoelectric fibers 10. Thus, the piezoelectric sensitivity of the piezoelectric fibers 10 to the tension is increased.

The insulating resin 100 is made of, for example, urethane, epoxy, acrylic, or polyester. Generally, urethane is softer and has a greater water absorption than acrylic or polyester. Epoxy is harder and has a lower water absorption than acrylic or polyester. Materials softer than and having greater elasticity than the piezoelectric fibers 10 are more unlikely to inhibit the piezoelectric sensitivity of the piezoelectric fibers 10 to the tension along the axial direction of the resin structure 1. On the other hand, materials having lower water absorption than the piezoelectric fibers 10 are unlikely to allow exposure of the piezoelectric fibers 10 to moisture and are thus capable of suppressing the hydrolysis of the piezoelectric fibers 10. The material for the insulating resin 100 may be appropriately selected according to the necessary softness and water absorption properties.

Figure 3A:
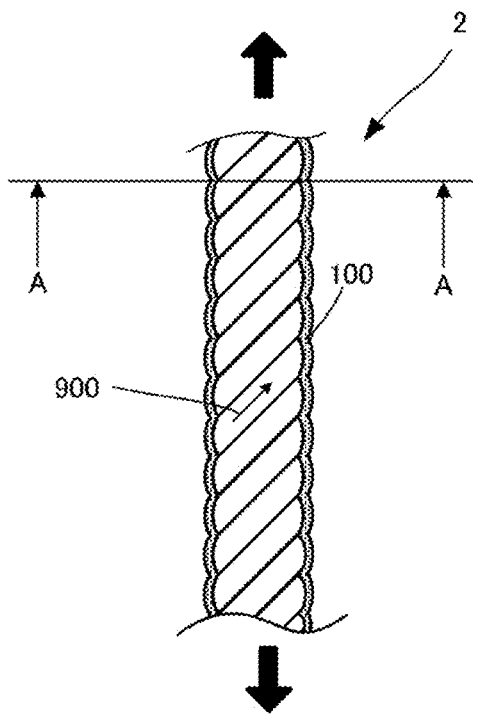
FIG. 3(A) is a view illustrating a configuration of a resin structure 2.
Figure 3B:
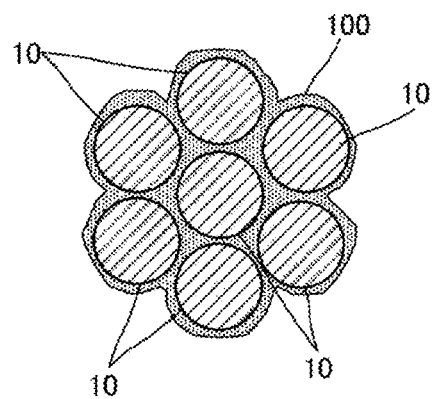
FIG. 3(B) is a sectional view along line A-A in FIG. 3(A).

In the meantime, FIG. 3(A) is a partially exploded view illustrating a resin structure 2 including piezoelectric fibers 10 that are right-twisted to constitute a right-twisted yarn (hereinafter, referred to as a Z yarn). FIG. 3(B) is a sectional view along line A-A in FIG. 3(A).

The resin structure 2 that is a Z yarn makes a stretching direction 900 of the piezoelectric fibers 10 inclined at 45 degrees to the right with respect to the axial direction of the resin structure 2. When the resin structure 2 as a Z yarn in this state is extended with tension, the piezoelectric fibers 10 are strained along the axial direction of the resin structure 2 to cause a shear stress along the axial direction of the resin structure 2.

The axial direction of the resin structure 2 corresponds to the first diagonal line 910A in the example of FIG. 2(B). Under this condition, the piezoelectric fibers 10 is, as illustrated in the example of FIG. 2(B), stretched in the direction corresponding to the first diagonal line 910A and contracted in the direction corresponding to the direction along the second diagonal line 910B.

Therefore, a positive charge is generated on a surface of the resin structure 2, and a negative charge is generated inside the resin structure 2. The piezoelectric fibers 10 generate a charge by application of the shear stress and therefore do not limit the inclination of the stretching direction 900 to the 45 degrees to the right with respect to the axial direction of the resin structure 2, and the stretching direction 900 at least needs to intersect the axial direction of the resin structure 2. That is, the stretching direction 900 of the piezoelectric fibers 10 only needs to be at more than 0 degrees and less than 90 degrees to the right with respect to the axial direction of the resin structure 2.

Figure 4:
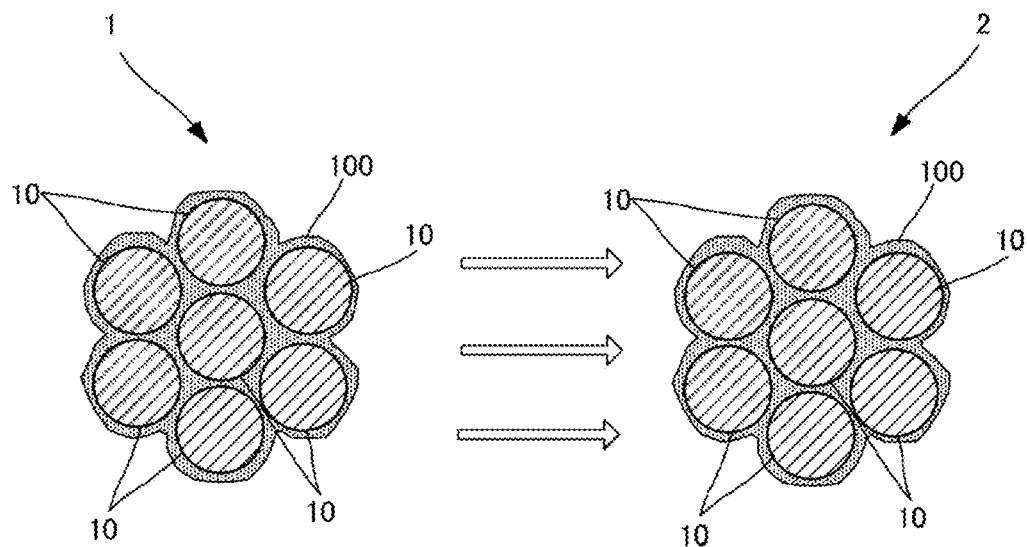
FIG. 4 is a view illustrating an electric field between the resin structures 1 and 2.

FIG. 4 is sectional views of the resin structures 1 and 2 illustrating a state of an electric field. When the resin structures 1 (S yarn) and 2 (Z yarn) are formed of PLLA, the application of tension makes the resin structure 1 singly have a negative potential on the surface and a positive potential inside the resin structure 1. Whereas the application of tension makes the resin structure 2 singly have a positive potential on the surface and a negative potential inside the resin structure 2.

When these resin structures 1 and 2 are brought close to each other, the close parts (surfaces) tend to have the same potential. This situation makes the close parts of the resin structures 1 and 2 0 V, and the resin structure 1 further increases the positive potential inside the resin structure 1 so as to keep the original potential difference. Similarly, the resin structure 2 further decreases the negative potential inside the resin structure 2.

In a cross section of the resin structure 1, an electric field directed from the inside toward the outside of the resin structure 1 is mainly formed, and in a section of the resin structure 2, an electric field directed from the outside toward the inside of the resin structure 2 is mainly formed. When the resin structures 1 and 2 are brought close to each other, the electric fields of the resin structures 1 and 2 leak in an air atmosphere and combined together, to form an electric field between the resin structures 1 and 2 as illustrated in FIG. 4 due to the potential difference between the resin structures 1 and 2. Alternatively, when the resin structure 1 (or the resin structure 2) and, for example, an object, such as a human body, having a prescribed potential (including a ground potential) are brought close to each other, an electric field is generated between the resin structure 1 (or the resin structure 2) and the close object.

Alternatively, an electric current sometimes flows in a current path formed due to humidity or the like between the resin structures 1 and 2 or in a circuit formed through a micro-discharge phenomenon or the like. When the resin structure 1 or 2 and a close object having a prescribed potential (including a ground potential) are brought close to each other, an electric current also sometimes flows in a current path formed due to humidity or the like or in a circuit formed through a micro-discharge phenomenon or the like.

The resin structures 1 and 2 do not have to have polarities reverse to each other. Even the resin structures 1 and 2 having potentials of the same polarity generate an electric field or an electric current when both the resin structures 1 and 2 have a potential difference. That is, the resin structures 1 and 2 only need to have different potentials when generating a charge.

Figure 5:
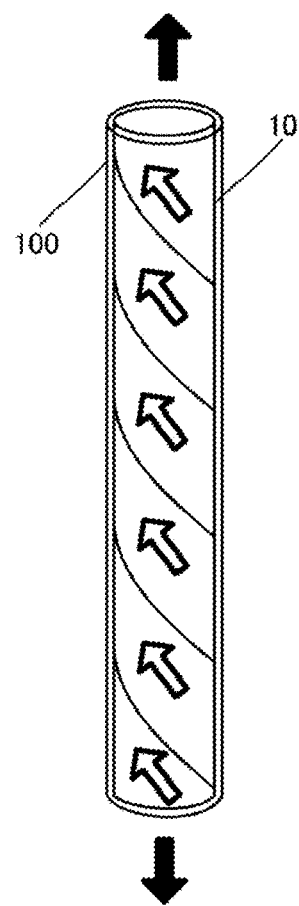
FIG. 5 is a view illustrating a configuration of a resin structure 1 formed by winding a film-shaped piezoelectric body.

The resin structure is not limited to the twisted yarn. For example, the resin structure of the present invention also includes, as illustrated in FIG. 5, a structure that includes an S yarn (or a Z yarn) formed by left- (or right-)winding a piezoelectric body 10A having a film shape, and covered with an insulating resin 100.

As the fiber generating a negative charge on a surface of the fiber, a Z yarn containing PDLA is also considered to be used in addition to the S yarn containing PLLA. Further, as the fiber generating a positive charge on a surface of the fiber, an S yarn containing PDLA is also considered to be used in addition to the Z yarn containing PLLA.

The resin structures of the present embodiment are used as, for example, an antibacterial fiber. Conventionally, it has been known that the proliferation of germs, fungi, and the like can be suppressed by an electric field (see, for example, Tetsuaki Tsuchido, Hiroki Kourai, Hideaki Matsuoka, and Junichi Koizumi "Microbial Control-Science and Engineering": Kodansha; and see for example, Koichi Takaki "Agricultural and Food Processing Applications of High-Voltage and Plasma Technologies," J. HTSJ, Vol. 51, No. 216). A potential generating an electric field sometimes causes an electric current to flow in a current path formed due to humidity or the like or in a circuit formed through a micro-discharge phenomenon or the like. The electric current is considered to weaken bacteria and thus suppress the proliferation of bacteria. The antibacterial fiber of the present embodiment causes an electric field to be generated between at least two piezoelectric fibers that have different potentials when generating a charge by application of external energy. Alternatively, when brought close to an object, such as a human body, having a prescribed potential (including a ground potential), the antibacterial fiber causes an electric field to be generated between the antibacterial fiber and the object having a prescribed potential. Alternatively, the antibacterial fiber of the present embodiment causes an electric current to flow via moisture or the like between at least two piezoelectric fibers that have different potentials when generating a charge by application of external energy. Alternatively, when brought close to an object, such as a human body, having a prescribed potential (including a ground potential), the antibacterial fiber causes an electric current to flow via moisture such as sweat between the antibacterial fiber and the object having a prescribed potential.

Therefore, the resin structure brings about a disorder to cell membranes of bacteria or a vital electron transfer system of bacteria due to a direct action of the electric field or the electric current generated by the piezoelectric fibers, to exert an effect of killing the bacteria or weakening the bacteria. Further, the electric field or the electric current sometimes changes oxygen contained in moisture to active oxygen species. Alternatively, a stress environment in the presence of the electric field or the electric current sometimes produces oxygen radicals in cells of bacteria. An action of the active oxygen species including the radicals kills or weakens bacteria. Further, the above-described reasons are sometimes combined to generate an antibacterial effect. The "bacteria" referred to in the present embodiment includes germs, fungi, archaebacteria, and microorganisms such as a mite and a flea. The term "antibacterial" is a concept including both the effect of weakening bacteria and the effect of killing bacteria.

The antibacterial fiber described above is applicable to, for example, clothing. Of the clothing, in particular, socks (or supporters) are inevitably stretched and shrunk along joints by movements such as walking, so that the antibacterial fiber generates a charge with high frequency. Further, although socks absorb moisture such as sweat and serve as hotbeds for the proliferation of bacteria, the antibacterial fiber is capable of suppressing the proliferation of bacteria and thus generates a remarkable effect as bacterium-countermeasure use for deodorization.

The piezoelectric fibers generate an electric field for their piezoelectricity and thus require no power source eliminating fear of an electrical shock. Further, the life of the piezoelectric fibers lasts longer than the antibacterial effect of drugs or the like. Further, the possibility of causing an allergic reaction by the piezoelectric body is lower than the possibility by the drugs. Further, expression of bacteria resistant to drugs, in particular, antibiotics and the like has been a big problem recently, but the antibacterial effect of the present embodiment is unlikely to generate resistant bacteria on mechanism.

Further, the resin structures of the present embodiment are also applicable for use in attracting substances. As described above, the resin structure 1 generates a negative charge on the surface when subjected to tension. The resin structure 2 generates a positive charge on the surface when subjected to tension. Therefore, the resin structure 1 has properties of attracting a substance (for example, particles such as pollen) having a positive charge, and the resin structure 2 attracts a substance (for example, harmful materials such as yellow sand) having a negative charge. The piezoelectric fibers generate an electric field for their piezoelectricity and thus require no power source. Further, the life of the piezoelectric fibers is long, and the strength of the generated charge does not change due to the attraction of substances. Therefore, unlike electret filters, the piezoelectric fibers do not decrease their attraction power along with the attraction of substances.

Further, the piezoelectric fibers 10 of the present embodiment are covered with the insulating resin 100 to increase the strength and enable prevention of early deterioration of the piezoelectric fibers caused by hydrolysis. For the prevention of deterioration caused by hydrolysis, the insulating resin 100 preferably has low water absorption properties. Further, in order not to inhibit the deformation of the piezoelectric fibers 10, the insulating resin 100 is preferably easily elastically deformed, that is, the insulating resin 100 preferably has high stretching properties. The insulating resin 100 is preferably more easily elastically deformed than the piezoelectric fibers 10.

The strength of the electric field is, as expressed by $E=V/d$, inversely proportional to the distance between substances generating a charge. An insulating resin that is excessively thicker than the piezoelectric fiber 10 excessively increases the distance between fibers and significantly decreases the strength of the electric field. Thus, the insulating resin 100 preferably has a thickness of, for example, 60% or less than the diameter of the piezoelectric fiber 10.

Figure 6:
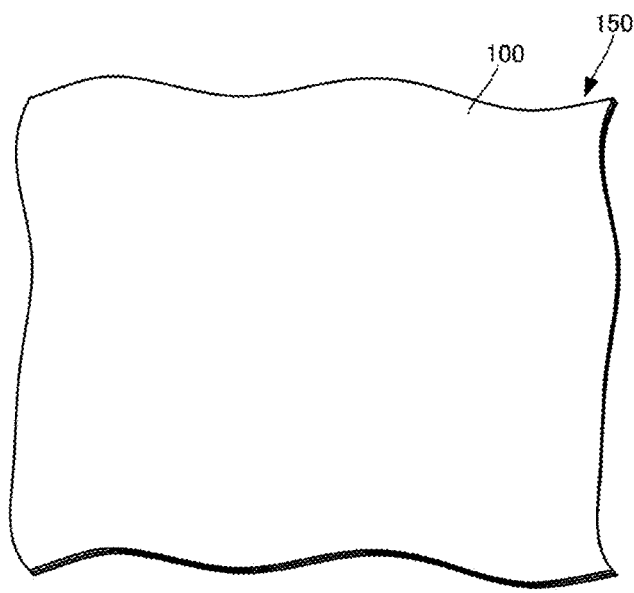
FIG. 6 is a schematic plan view of a cloth 150.

FIG. 6 is a schematic plan view of a cloth 150. The cloth 150 has resin structures 1 woven or knitted therein. The cloth 150 may be produced by first preparing a cloth having S yarns or Z yarns woven (or knitted) therein, the S yarns or the Z yarns being made of a plurality of piezoelectric fibers 10, and then covering the cloth with an insulating resin 100. Alternatively, the cloth 150 may be produced by preparing a cloth having resin structures 1 woven (or knitted) therein, the resin structures 1 being covered with an insulating resin 100, and further covering the cloth with the insulating resin 100.

Alternatively, the cloth 150 may be a nonwoven cloth formed by bonding or tangling a plurality piezoelectric fibers 10. Also in this case, each of the plurality of piezoelectric fibers 10 may be covered with an insulating resin 100 and then bonded or tangled with each other, or the plurality of piezoelectric fibers 10 may be bonded or tangled with each other and then covered with the insulating resin 100.

The cloth 150 in these states is also an example of the resin structure of the present invention. The cloth 150 may include normal fibers having no piezoelectric properties. The cloth 150 may include either one of the resin structure 1 or 2 or include both the resin structures 1 and 2.

Figure 7A:
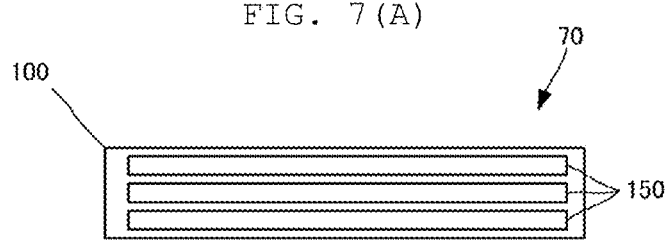
FIG. 7(A) is a sectional view of an antibacterial substrate 70.
Figure 7B:
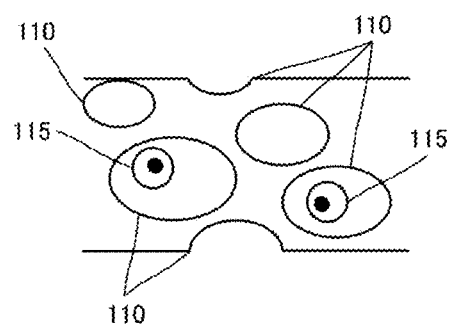
FIG. 7(B) is a partially enlarged sectional view of the antibacterial substrate 70.

Next, FIG. 7(A) is a sectional view of an antibacterial substrate 70, and FIG. 7(B) is a partially enlarged sectional view of the antibacterial substrate 70. The antibacterial substrate 70 includes a plurality of cloths 150. The plurality of cloths 150 are covered with an insulating resin 100.

Each of the cloths 150 may include either one of the resin structure 1 or 2 or include both the resin structures 1 and 2.

As illustrated in FIG. 7(B), the insulating resin 100 is a porous material having a plurality of pores 110 therein. The insulating resin 100 having the plurality of pores 110 allows easy intrusion of bacteria 115 and enables the bacteria 115 to be retained in the pores 110. Due to this configuration, the antibacterial substrate 70 is more efficiently capable of killing the bacteria 115 or suppressing the proliferation of the bacteria 115 retained in the pores.

In addition, the application of tension or a compression load to the antibacterial substrate 70 causes the cloths 150 held by the insulating resin 100 to be subjected to tension or compression. Therefore, piezoelectric fibers 10 constituting the cloths 150 generate a charge. This charge generates an electric field inside the antibacterial substrate 70, and the strength of the electric field changes. Therefore, the antibacterial substrate 70 is capable of suppressing the proliferation of the bacteria 115 by the electric field and the change in strength of the electric field.

Figure 8:
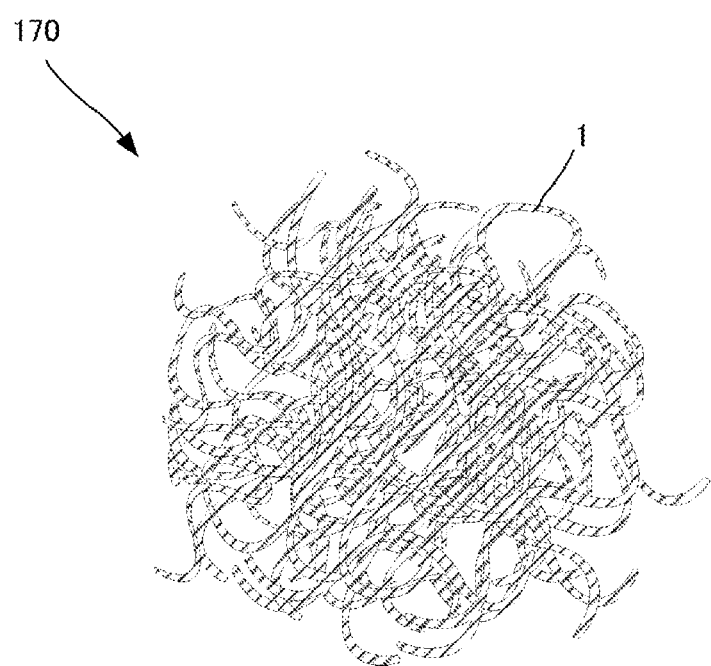
FIG. 8 is a schematic view illustrating a shape of an antibacterial substrate 170.

The shape of the antibacterial substrate 70 is not limited to the one illustrated in FIG. 7(A). For example, an antibacterial substrate 170 illustrated in FIG. 8 has a structure formed by tangling a plurality of resin structures 1 with each other. The antibacterial substrate 170 may also include either one of the resin structure 1 or 2 or include both the resin structures 1 and 2. The antibacterial substrate 170 may be produced by covering each of the plurality of piezoelectric fibers 10 with the insulating resin 100 and then tangling the piezoelectric fibers 10 with each other, or may be produced by tangling the plurality of piezoelectric fibers 10 with each other and then covering the piezoelectric fibers 10 with the insulating resin 100.

The antibacterial substrate 170 includes therein many voids among the plurality of resin structures 1. Accordingly, the antibacterial substrate 170 has a large surface area for contacting with bacteria to enable an efficient antibacterial action. The piezoelectric fibers 10 constituting the resin structure 1 are variously directed to generate electric fields having various degrees of strength, in response to the tension or the compression load from any direction. Accordingly, the antibacterial substrate 170 enables an efficient antibacterial action.

Finally, the description of the present embodiments is to be considered in all respects as illustrative and not restrictive. The scope of the present invention is indicated not by the above-described embodiments but by the claims. Furthermore, it is intended that the scope of the present invention includes all variations within meanings and scopes equivalent to the claims.

DESCRIPTION OF REFERENCE SYMBOLS

1, 2: Resin structure
10: Piezoelectric fiber
10A: Piezoelectric body
70, 170: Antibacterial substrate
100: Insulating resin
110: Pore
115: Bacterium

150: Cloth
900: Stretching direction

The invention claimed is:

1. A resin structure comprising:
a plurality of piezoelectric fibers that generate a charge by application of external energy; and
an insulating resin coating at least one of the plurality of piezoelectric fibers, wherein the insulating resin is porous.

2. The resin structure according to claim 1, wherein the insulating resin has a greater elasticity than that of the plurality of piezoelectric fibers.

3. The resin structure according to claim 2, wherein the insulating resin has a lower water absorption than that of the plurality of piezoelectric fibers.

4. The resin structure according to claim 1, wherein the insulating resin has a lower water absorption than that of the plurality of piezoelectric fibers.

5. The resin structure according to claim 1, wherein the plurality of piezoelectric fibers comprise a polylactic acid material.

6. The resin structure according to claim 1, wherein the plurality of piezoelectric fibers have a circular sectional shape.

7. The resin structure according to claim 1, wherein the insulating resin has a thickness of 60% or less of a diameter of the at least one of the plurality of piezoelectric fibers.

8. The resin structure according to claim 1, wherein the plurality of piezoelectric fibers are a left-twisted yarn.

9. The resin structure according to claim 8, wherein all of the plurality of piezoelectric fibers are covered with the insulating resin.

10. The resin structure according to claim 1, wherein all of the plurality of piezoelectric fibers are covered with the insulating resin.

11. The resin structure according to claim 1, wherein a stretching direction of each of the plurality of piezoelectric fibers coincides with an axial direction of each of the plurality of piezoelectric fibers.

12. The resin structure according to claim 1, wherein the plurality of piezoelectric fibers are twisted together such that a stretching direction of the plurality of piezoelectric fibers is inclined at 45 degrees with respect to an axial direction of the resin structure.

13. The resin structure according to claim 1, wherein the insulating resin comprises one of urethane, epoxy, acrylic, and polyester.

14. The resin structure according to claim 1, wherein the plurality of piezoelectric fibers are a right-twisted yarn.

15. The resin structure according to claim 14, wherein all of the plurality of piezoelectric fibers are covered with the insulating resin.

16. The resin structure according to claim 1, wherein the at least one of the plurality of piezoelectric fibers is a wound piezoelectric body having a film shape.

17. A structure comprising a cloth including the resin structure of claim 1.

18. The structure of claim 17, wherein the insulating resin is a first insulating resin, the structure further comprising a second insulating resin coating the cloth.

19. A structure comprising:
a cloth including a plurality of piezoelectric fibers that generate a charge by application of external energy;
and an insulating resin coating the cloth, wherein the insulating resin is porous.

* * * * *